United States Patent [19]
Biallas et al.

[11] Patent Number: 5,393,711
[45] Date of Patent: Feb. 28, 1995

[54] PROCESS FOR MANUFACTURING SEMICONDUCTOR COMPONENTS

[75] Inventors: Vesna Biallas; Herbert Goebel; Richard Spitz, all of Ruetlingen, Germany

[73] Assignee: Robert Bosch GmbH, Stuttgart, Germany

[21] Appl. No.: 211,670

[22] PCT Filed: Sep. 17, 1992

[86] PCT No.: PCT/DE92/00792

§ 371 Date: Apr. 12, 1994

§ 102(e) Date: Apr. 12, 1994

[87] PCT Pub. No.: WO93/08592

PCT Pub. Date: Apr. 29, 1993

[30] Foreign Application Priority Data

Oct. 12, 1991 [DE] Germany .................. 4133820.0

[51] Int. Cl.$^6$ ........................ H01L 21/469
[52] U.S. Cl. .................. 437/231; 437/226; 437/228; 437/917; 437/974; 148/DIG. 135
[58] Field of Search ............ 437/231, 226, 228, 915, 437/974; 148/DIG. 135

[56] References Cited

U.S. PATENT DOCUMENTS

| | | | |
|---|---|---|---|
| 3,852,876 | 12/1974 | Sheldon et al. | 29/583 |
| 4,179,794 | 12/1979 | Kosugi et al. | 29/580 |
| 4,700,466 | 10/1987 | Nakagawa et al. | 437/915 |
| 4,774,196 | 9/1988 | Blanchard | 148/DIG. 135 |
| 4,960,731 | 10/1990 | Spitz et al. | 437/152 |
| 5,006,487 | 4/1991 | Stokes | 437/228 |
| 5,047,364 | 9/1991 | Hattori | 437/226 |
| 5,169,472 | 12/1992 | Goebel | 148/DIG. 135 |
| 5,179,035 | 1/1993 | Shannon | 437/974 |
| 5,185,295 | 2/1993 | Goto et al. | 437/226 |
| 5,231,045 | 7/1993 | Miura et al. | 437/974 |
| 5,238,875 | 8/1993 | Ogino | 148/DIG. 135 |
| 5,261,999 | 11/1993 | Pinker et al. | 437/974 |

FOREIGN PATENT DOCUMENTS

| | | |
|---|---|---|
| 0269294 | 6/1988 | European Pat. Off. . |
| 0341075 | 11/1989 | European Pat. Off. . |
| 3815615A1 | 11/1989 | Germany . |
| WO92/09099 | 5/1992 | WIPO . |

*Primary Examiner*—Brian E. Hearn
*Assistant Examiner*—Kevin M. Picardat
*Attorney, Agent, or Firm*—Kenyon & Kenyon

[57] ABSTRACT

A process for manufacturing semiconductor components, especially diodes. The process entails first bonding two semiconductor wafers of different conducting types (p and n), according to a silicon-fusion bonding process (SFB), thereby forming a bonded wafer assembly with a p-n junction. The bonded wafers are then partitioned into a plurality of semiconductor elements by the cutting of grooves into the bonded wafers to a depth which extends at least to the p-n junction. Each of the plurality of semiconductor elements thus formed has an individual p-n junction with sides exposed by the grooves. The sides of the semiconductor elements are then subjected to etching and passivation. The upper and lower surfaces of the bonded wafer assembly are then metal-coated. Finally, the semiconductor elements are separated from each other by a sawing operation.

20 Claims, 4 Drawing Sheets

PROCESS FOR MANUFACTURING SEMICONDUCTOR COMPONENTS

FIELD OF THE INVENTION

The present invention concerns a process for the production of semiconductor elements, especially diodes.

BACKGROUND OF THE INVENTION

A process is known from German Patent Application No. 38 15 615 for producing a high-blocking power diode, that results from doping a semiconductor material by diffusion. Boron and phosphorous are applied to the two main surfaces of a semiconductor body, and then in a first diffusion phase these two doping substances are brought to a particular diffusion depth-by warming the semiconductor body, to which they were applied, to a certain temperature. Also known is the use of doping foils for applying doping substances, which are placed on the semiconductor body. Suitable conditions for the first diffusion step are a diffusion temperature of, for example, 1200° C. and a diffusion time of 30 hours in an oxidizing atmosphere. This diffusion process is also connected with a "getter" process, which provides for a sufficiently high charge-carrying lifetime. Next, thin metal layers are applied to the two exposed surfaces of the semiconductor body, where the kind of metal layer is determined by the field of use. For solder processes, for example, the layer sequence Al/Ni (aluminum/nickel) or Cr/Ni/Ag (chromium/nickel/silver) is suitable. Next, the semiconductor body is divided into chips by a sawing or other separation process. After the division, the individual chips are soldered between two contacts, that are composed advantageously of copper. After this soldering process, both surfaces of the chip ends are completely covered by solder and the contacts. The pn-junction that has been exposed on the sides and damaged by the sawing process is then etched with moist chemicals in a hot potash lye or in plasma, in order to eliminate the damages. Because of the covering of the chip-end surfaces by solder and the contacts, they are well protected against removal during the etching process. Then the prepared power diode can be covered with plastic, for example, so that it is protected passively and against environmental influences. Only when the power diodes are finally assembled and packaged can they be measured electrically and thus tested.

For the production of Zener (breakdown) diodes, the following process is known: A process used for the production of mesa diodes is used with epitaxy and photolithography steps. In addition, V-shaped grooves are etched, where the entire production takes place in clean-room conditions. Maintaining clean-room conditions leads to relatively high costs. For production of Schottky diodes, a photolithography step is likewise used and clean-room conditions are necessary. Also critical for series production is the contact between metal and silicon (Si), since this determines a well-defined state for the Si surface. Schottky diodes exhibit relatively high blocking-state currents and are not pulse-resistant.

Finally, it is also known that epitaxy layers and photolithography steps under clean-room conditions are necessary in the production of plane diodes.

In known processes for producing high-blocking diodes, the desired doping is first produced in a diffusion process, and then both wafer sides are metal-coated with, for example, Ni/Au (nickel/gold). Then both sides are coated with paint for protection of the metal coating against the following production steps. Next a grid is sawed, where the separation cuts are maintained by a specially V-shaped saw. Then an acid etching takes place within the grooves. Then, for passivation, the grooves are filled with polyimide paint by means of a doctor blade. Then the paint is stripped from the metal coating by a plasma stripper. Finally, separation into individual chips takes place by sawing.

SUMMARY OF THE INVENTION

The present invention relates to a process for manufacturing semiconductor components, especially diodes. The process of the present invention entails first bonding two semiconductor wafers of different conducting types (p and n), according to a silicon-fusion bonding process (SFB), thereby forming a bonded wafer assembly with a p-n junction. The bonded wafers are then partitioned into a plurality of semiconductor elements by the cutting of grooves into the bonded wafers to a depth which extends at least to the p-n junction. Each of the plurality of semiconductor elements thus formed has an individual p-n junction with sides exposed by the grooves. The sides of the semiconductor elements are then subjected to etching and passivation. The upper and lower surfaces of the bonded wafer assembly are then metal-coated. Finally, the semiconductor elements are separated from each other by a sawing operation.

The production process according to the present invention has an advantage over the prior art in that instead of diffusion, a silicon-fusion bonding (SFB) process is used that requires significantly lower temperatures for significantly shorter times. Also, metal coating of a semiconductor component produced according to the present invention occurs only at the end of the process, which means that the pn-junctions can be also passivated, especially by thermal oxidation. This is no longer possible if there is already metal on the wafer. With the process of the present invention, it is completely possible to use higher temperatures for passivation. If the grooves (pn-junctions) are over-etched, there is no danger, with the process of the present invention, that the metal will be touched, since no metal is present. This could happen in the known patented paint-coating process, if the paint is not sufficiently thick or the paint is not sufficiently adhesive. Thus, according to the present invention, at least two semiconductor bodies of different conducting types (p-conduction, n-conduction) are connected together after the SFB process. Then separation into a large number of semiconductor elements occurs by the creation of grooves, the depth of which extends at least to the pn-junction. The grooves advantageously penetrate one of the two semiconductor bodies completely and continue into the second semiconductor body in such a way that only a partial section of the total thickness of the second semiconductor body is affected by the grooves. By subsequent passivation of the surfaces of the sides of the pn-junctions exposed by the grooves, a protection is created. Then the surfaces of the semiconductor body are metal-coated and separation into semiconductor elements is performed. Advantageously, after passivation, such as by filling the grooves with polyimide paint for example, a grinding process can be performed to make the surfaces of the semiconductor bodies even. If a metal coating were already present—as is the case in the prior art—then no trace of the polyimide paint that serves for passivation should remain on the surfaces that have already been metal-coated and protected by paint. This, however, means that there is no possibility for mechanical removal; that is, the grinding process mentioned could not be performed on a component produced in accordance with the prior art. The process of the present invention has an advantage over the prior art, in that the solderability of the metal coating is not affected or even made impossible. This can, however, have the result in a process according to the prior art, that polyimide remnants remain or—if the gold layer is not completely sealed—it can be made worse by plasma stripping of the moistening behavior of the nickel (Ni) in the soldering process. Beyond this, in the known diffusion processes, the wafer thickness must be chosen as thin as possible, which has the consequence of a low mechanical stability during handling. With the process of the present invention, in contrast, it is possible to use semiconductor bodies of corresponding thickness and stability to be worked by the SFB process. The process of the present invention does not require the use of special saws (which are required for creation of the V-shaped grooves, for example). There are standard saws that can be used for the separation and division process. The process of the present invention also requires no costly photolithography process steps. In addition, no clean room is required for processing the wafer. The SFB process can be performed in a laminar-flow box or a suitable closed apparatus. The SFB technique leads, in contrast to diffusion processes, to significantly lower production costs. With the process of the present invention, it is also possible to create grooves with essentially perpendicular walls, which require significantly less wafer surface than with the V-shaped grooves of the prior art. These small division grooves between the individual semiconductor elements (chips) not only save on the silicon surface, but they can also be created with conventional saws and with a high cutting speed. Also, they are very easy to refill with paints, such as polyimides for example, in order to create a plane surface for the following metal-coating. Advantageously, the groove widths are between 100 $\mu$m and 150 $\mu$m after the etching process is performed. It is also advantageous for the wafers to be given a "111" crystal orientation, since in potash lye, the wafer surfaces are only etched (thinned) very weakly, in comparison to the advantageously sawed grooves. An expensive surface masking of the wafer can be avoided during overetching of the grooves in lye. Since by the SFB method, there is already a high boron concentration at the pn-junction (for example $> 10^{19}$ cm$^{-3}$), the etching process is automatically stopped there. By freely choosing the thickness of the wafer, for example the p$^+$-wafer—as already mentioned—sufficient mechanically stability for wafer handling can be provided even for wafer diameters larger than, for example, 100 mm. With the process of the present invention, one does not pay the price for this with drastically prolonged diffusion times. Also, the relatively large thickness of, for example, the p$^+$-wafer, can be used as a heat buffer for power diodes (especially in impulse operation). With the "selectable" mechanical stability of the wafer system, it is also possible to perform a simultaneous "sputter"-flow process. Both sides of the wafer system are simultaneously coated with a layer sequence, which, because of the flow process, can be worked completely automatically with a flow system. The sputter metal-coating process is suitable with special metals and metal sequences directly for unpolished Si surfaces—as with objects according to the present invention—thus they are also best suitable for the Si surfaces production process according to the present invention. It is especially advantageous on the basis of the present invention that the individual chips are already able to be measured electrically right after the separation (sawing or other division process), since the chips are already passivated in this state. Chips that have been passivated in this way can also be soldered directly without individual assembly and packaging (as is necessary, in contrast, with the prior art) directly into a suitable cold body. The production process according to the present invention is suitable both for the production of high-blocking power diodes and for Zener power diodes. They can be worked especially rationally, since wafers with large diameters, for example 150 mm, can be used, without having long-lasting diffusion steps.

According to a further development of the present invention, the silicon-fusion bonding process is performed advantageously at temperatures over 1000° C. for more than an hour, in particular at 1080° C. for two hours in a nitrogen atmosphere. The separation of the individual semiconductor elements (chips) by making grooves takes place advantageously by sawing. As already mentioned, the depth of the saw cuts is chosen in such a way that one wafer is completely and the other wafer partly sawed apart or sawed into. The etching to eliminate the damages to the pn-junctions resulting from the sawing process are preferably performed by wet chemicals, especially with hot potash lye.

For passivation, the following variations can be performed. Passivation can take place with polyesterimide paint or something similar applied in the grooves. This paint can be diluted with water. Passivation is also possible by thermal oxidation, especially above 1000° C., and then applying paint, especially polyesterimide paint. Passivation is also possible by precipitation of a substance, especially by means of a pyrolytic precipitation substance, advantageously by precipitation of silicon nitride. In addition, passivation can also take place applying polyimide paint in the grooves.

After the surface of the wafer system consisting of the two wafers is removed by means of a mechanical grinding process, prior to the metal-coating process, so that only the pure wafer material still remains, metal is vapor-deposited and/or deposited by sputtering on to the surface. As mentioned, the surfaces of both wafers can advantageously be metal-coated simultaneously.

With subsequent division into individual chips by separation from the wafer system, the required division gaps are formed in the grooves filled by the passivation in such a way that both wafers are completely penetrated and passivation material is left to cover the sides of the semiconductor elements (for protection of the pn-junctions). These division gaps are formed advantageously by sawing the wafer system. They have parallel cutting edges and thus need little space.

DETAILED DESCRIPTION OF THE DRAWINGS

Figure 1:
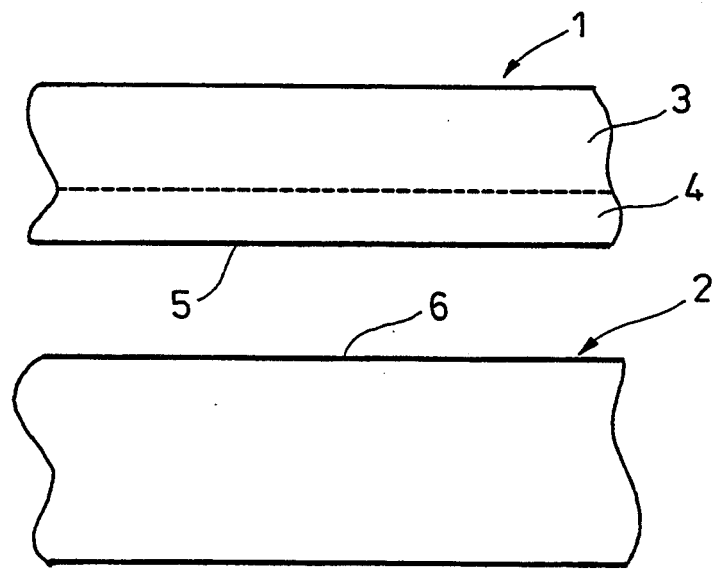
FIG. 1 shows two wafers that are to be connected together.

The procedure for producing semiconductor elements will be explained below by means of the figures. Specifically, an example of a high-blocking PIN power diode will be explained. As shown in FIG. 1, the starting materials are 2 wafers 1 and 2 of silicon, which have a "111" crystal orientation. Wafer 1 involves a so-called n-type, with a total thickness of 245 μm. It has a layer 3 with a thickness of 170 μm, where the n-doping is $>1 \cdot 10^\circ$ cm$^{-3}$ (n+-type, phosphorous) and a layer 4 with a thickness of 75 μm with n=7·10$^{13}$ cm$^{-3}$ (boron). Wafer 1 thus involves a so-called rear-diffused wafer.

Wafer 2 is doped homogeneously; it has a thickness of 350 μm and is of a p-type, with p=8·10$^{19}$ cm$^{-3}$ (boron). The surfaces 5 and 6 of the wafers 1 and 2 are polished.

Figure 2:
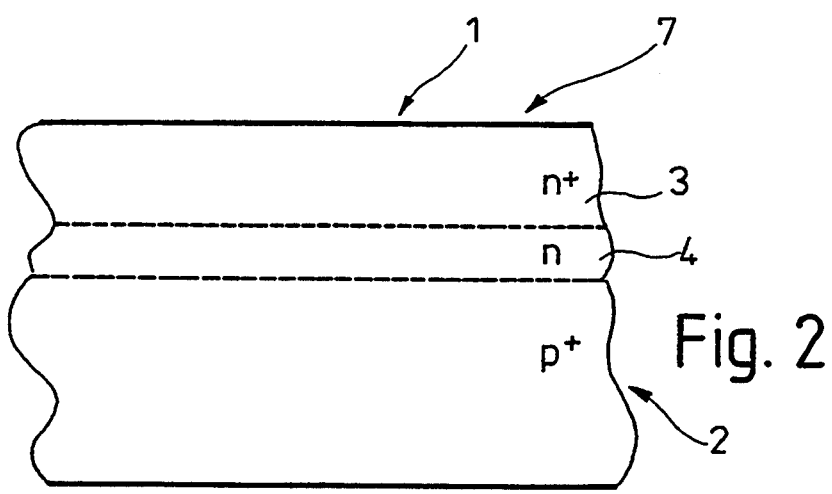
FIG. 2 shows the bonded wafers according to FIG. 1 after the silicon-fusion bonding (SFB) process.

Wafers 1 and 2 are subjected to an RCA cleaning before they are bonded together. The bonding takes place in a particle-free atmosphere (laminar-flow box or similar apparatus) with an operating temperature of 1080° C. for two hours in an N$_2$ atmosphere according to silicon-fusion-bonding (SFB). Wafers 1 and 2 bonded together are now represented in FIG. 2 as the resulting wafer system 7.

Wafer 2 (p+-wafer) can—like wafer 1—have a diameter of 150 mm, for example. In contrast to the above data, it can also be chosen thinner, if it has only a diameter of 100 mm, for example. A thickness of 250 μm, for example, would then be sufficient. Wafer 2 serves for mechanical stability in the handling of wafer system 7.

Figure 3:
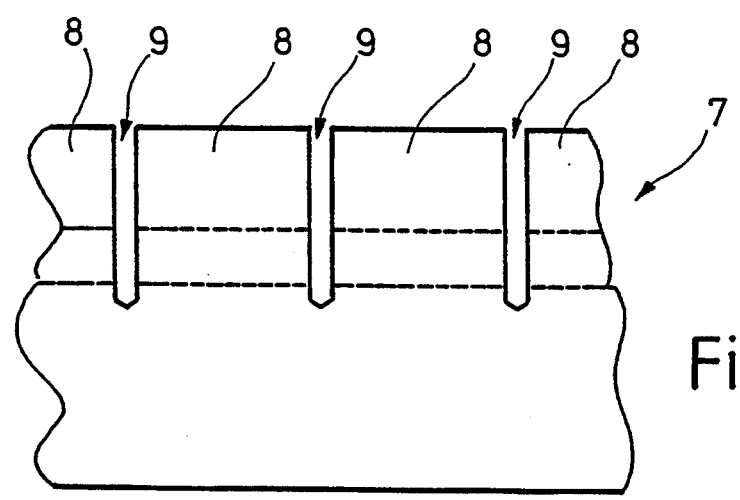
FIG. 3 shows the grooves made in the wafer system for separation into a large number of semiconductor elements (chips).

According to FIG. 3, the wafer system 7 is separated into a large number of semiconductor elements (chips 8) by the creation of grooves 9. This takes place with an ordinary Si saw with a diamond blade. The grid formed by the sawing is chosen according to the desired diode areas, for example edges of 3.8 mm×3.8 mm. The depth of the grooves 9 in the implementation example shown is about 260 μm; deep enough so that they extend into the lower p+-wafer 2. With this, the pn-junctions are exposed. The width of the grooves is about 30 μm to 35 μm.

Figure 4:
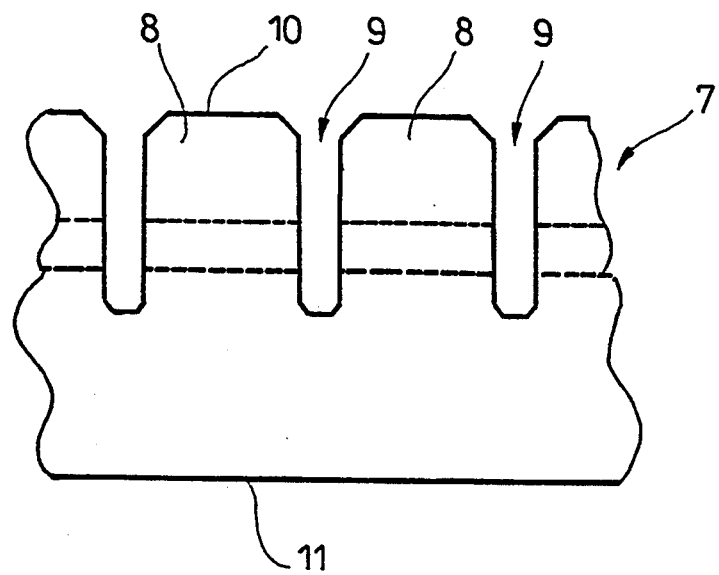
FIG. 4 shows widening of the grooves by an etching process.

In the following process step (FIG. 4), the pn-junctions that have been exposed and thereby damaged by the sawing are etched by wet chemicals, especially in hot potash lye (for example 30% KOH at 80° C., 25 min.), to remove the damages. This leads to a removal of about 30 μm on each side. By the removal of a 30-μm side region, all damages are certainly removed, so that the resulting diode then has only small leakage currents even at high blocking voltages (for example 750 V). The potash lye etches the "111" orientation surfaces slowest in relation to all other orientations, so that during removal from the sides of the grooves 9 the surfaces 10 and 11 of the wafer system 7 are practically not affected at all. If a surface roughness (lapped area) develops, it is somewhat evened by the etching. In implementing the procedure with a lateral removal by etching of about 30 μm in the grooves 9, the lapped surfaces 10 and 11 of the wafer system are merely removed by about 5 μm, so that the total thickness of the wafer system 7 only decreases by about 10 μm.

Now a passivation of the pn-junctions exposed by the grooves 9 takes place by filling the grooves 9. This can be performed in several ways:

A. Filling the grooves 9 takes place with a polyesterimide paint 12. This paint is thinned with water, so that its properties are well-suited to the process. If a poly-esterimide paint layer is applied, it should be very thin, advantageously between 5 μm and 15 μm, in order to avoid formation of bubbles during hardening. The paint is advantageously dropped onto the bonded wafers 1 and 2, lying horizontally with the grooves 9 upward, and distributed into the grooves with a doctor blade. If the depth of the grooves 9 in relation to the width is more than about 3:1, the grooves are filled quite homogeneously by capillary action. This is supported by a low viscosity and suitable surface tension of the paint. Both are controlled by selection of the solvent. A mixture of water and n-methyl pyrrolidone (NMP) in the following ratio is especially advantageous:

| polyesterimide | 10% to 20%, especially 17% |
| water | 40% to 50%, especially 50% |
| NMP | 30% to 40%, especially 33% |

The wafers 1, 2 are advantageously warmed to 70° C. for this process step. The paint is distributed evenly in the grooves 9 by capillary action, where the over-etched regions are moistened very well. Then water and solvent are advantageously expelled by a temperature treatment at 120° C. This takes place advantageously in contact with the air atmosphere. If this process step is performed, the pn-junctions are passivated. In order (because of the subsequent metal-coating) to fill the grooves 9 more completely (evenly), the described process of applying and drying polyesterimide paint is repeated at least once, twice if necessary. Then a hardening takes place, advantageously at 260° C. for four hours.

B. Passivation can also take place by thermal oxidation and filling the grooves 9 with paint, especially polyesterimide paint. Since at this stage of the process no metal coating has yet been applied, a high-temperature process, as represented by thermal oxidation, can be performed. This process takes place advantageously at 1000° C. to 1100° C., where an oxide layer of about 1 μm to 1.3 μm remains. Then the polyesterimide-paint application described above is performed one or two times to make the surface even.

C. Passivation can also take place by a CVD-nitride (Si$_2$N$_4$ layer by a pyrolytic removal). Silicon nitride is known as an especially good blocker against Na (sodium). For filling the grooves passivated in this manner, application of polyesterimide paint is again envisioned.

D. Finally, the passivation and plantation can also take place with polyimide paint. This paint is applied to the wafer system 7 and distributed with a doctor blade, with which it is brushed into the grooves 9. Then hardening takes place at 260° C. In principle, one can proceed with polyimide paint as under alternatives B and C.

Figure 5:
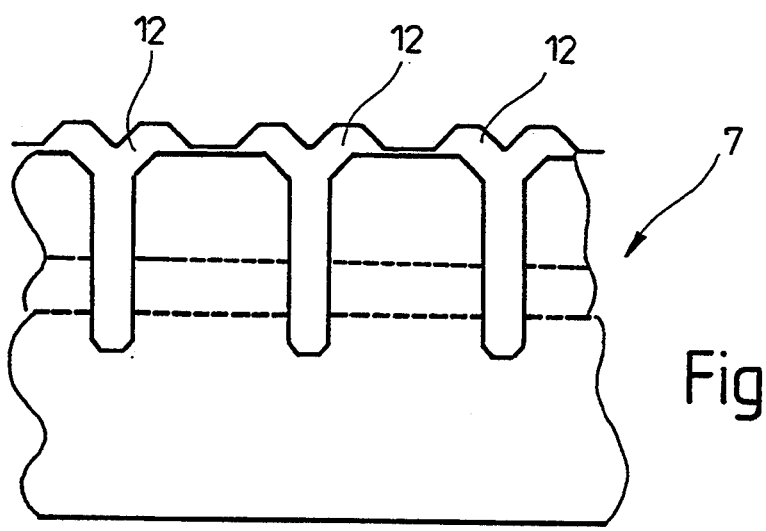
FIG. 5 shows passivation of the pn-junctions exposed by the grooves by applying a paint.
Figure 6:
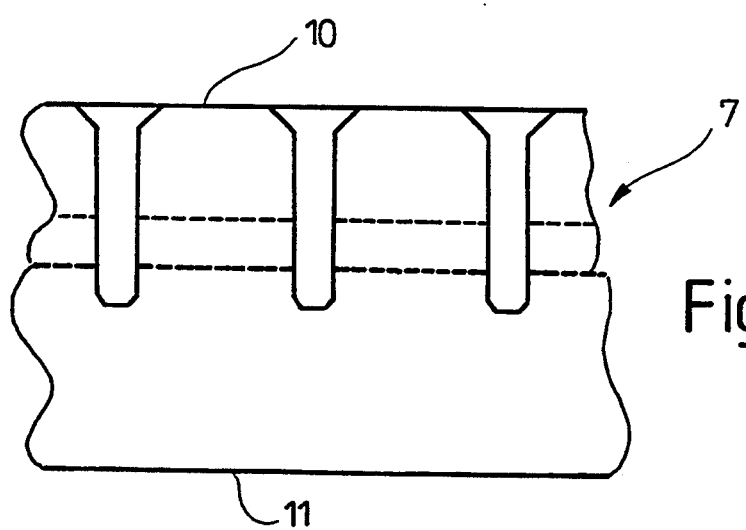
FIG. 6 shows the wafer system with surfaces made even by mechanical grinding.

After passivation and planation, the state according to FIG. 5 is achieved. Now—according to FIG. 6, the surface 10 of the wafer system 7 is made even by a mechanical grinding process and removed to the point where the Si material is again completely exposed. A three-stage process with an automatic grinding machine is performed advantageously, by which the surface 10 becomes smoother at each stage, followed by a cleaning step (with distilled-water and "brushes"). If a thermal oxidation is performed for passivation (as described above), then the surface 11 of the wafer 7 is ground, so that the Si surfaces are again completely exposed there as well.

Figure 7:
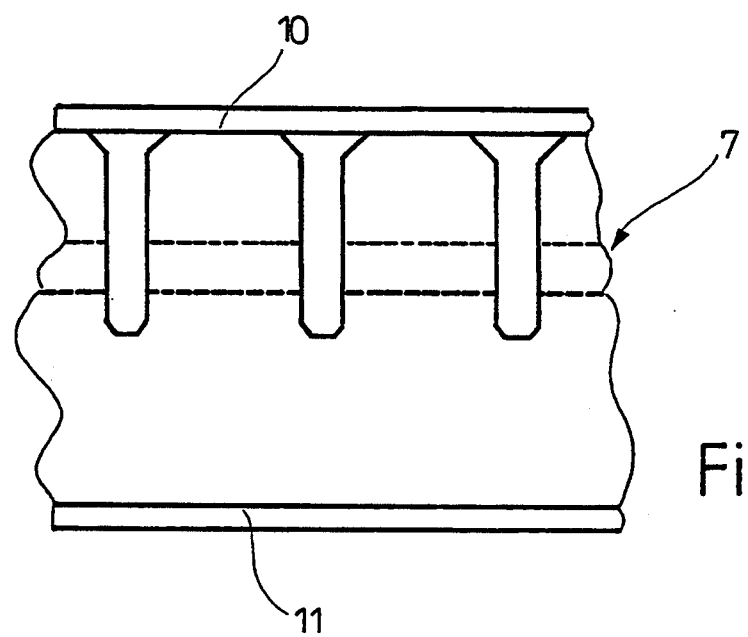
FIG. 7 shows the wafer system with the metal coating applied to the surfaces.
Figure 8:
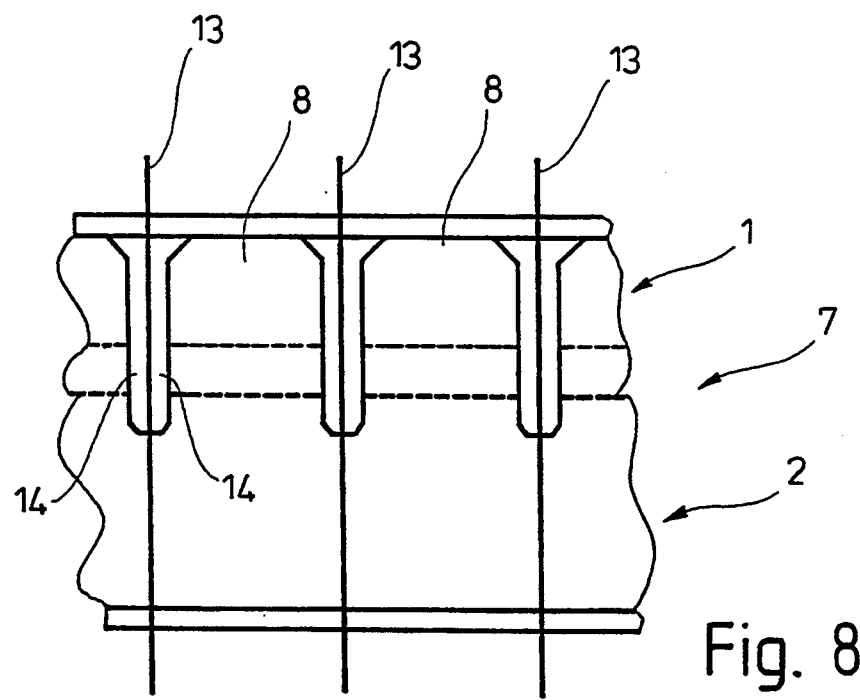
FIG. 8 shows the wafer system with cutting edges for separating the individual semiconductor elements.

In the following production step—according to FIG. 7—metal is applied to surfaces 10 and 11. For this metal-coating, the Si surfaces 10 and 11 are freed of possibly existing surface oxide by "dip etching" in hydrofluoric acid and then coated with metal. This coating can take place by distillation or sputtering. Preferred layer sequences are Cr (chrome) or Ti (titanium) as an adhesive layer (layer thicknesses 50 to 100 nm) and Ni (nickel) or Ni-V (nickel-vanadium) as a solderable layer (with about 7-10% vanadium, layer thickness 0.25 to 1 $\mu$m). A layer of Au (gold) or Ag (silver) (layer thickness 20-100 nm) that serves as a flux material in the soldering process is envisioned as a protective layer. It is quite especially advantageous that the surfaces 10 and 11 of the wafer system 7 are simultaneously sputtered with the same metal on both sides. In a first station, Cr (chrome) is applied by sputtering, and then—at a next station of a continuous sputtering system with vacuum—Ni-V (nickel-vanadium) is applied by sputtering. At a third station, Ag (silver) is applied advantageously by sputtering. Altogether, this application can be done in a relatively short time with high precision (high uniformity). The process according to the present invention, in which both sides are coated simultaneously, has considerable advantages over known processes, in which one wafer side is coated and then only after that the other wafer side is coated. In contrast with a vapor treatment, for example, it is avoided, in the process of the present invention, that a finished coated surface is contaminated with metals when the other surface is being coated, which would thus jeopardize the soldering capability. It is also avoided, in the process of the present invention, that the second, not yet coated surface is contaminated when the first surface is being coated, so that the metal layer would no longer adhere there well, later on. Simultaneous coating of both sides also has the advantage that both sides are treated shortly after over-etching with hydrofluoric acid, so that no time is lost while, for example, one side is handled and the other side is only coated later. It is not required that the applied metal-layer sequences on a component produced according to the present invention be temperature treated (for example at 450° C.–500° C.), since the Si surfaces 10 and 11, prepared by grinding, are very suitable for application of this metal coating.

In the last process step, the individual chips 8 are separated by saw cuts 13. The division gaps formed by the saw cuts 13 are located within the grooves 9 that were filled by the passivation in such a way that both wafers 1 and 2 are completely penetrated and passivation material 14 remains on both sides of the division gaps to cover the sides of the chips 8 (covering the pn-junctions)

After the individual semiconductor elements (chips 8) are separated out, semiconductor components are present, which can immediately be premeasured electrically and thus tested, without having to be previously assembled or introduced into a housing, or encased.

Figure 9:
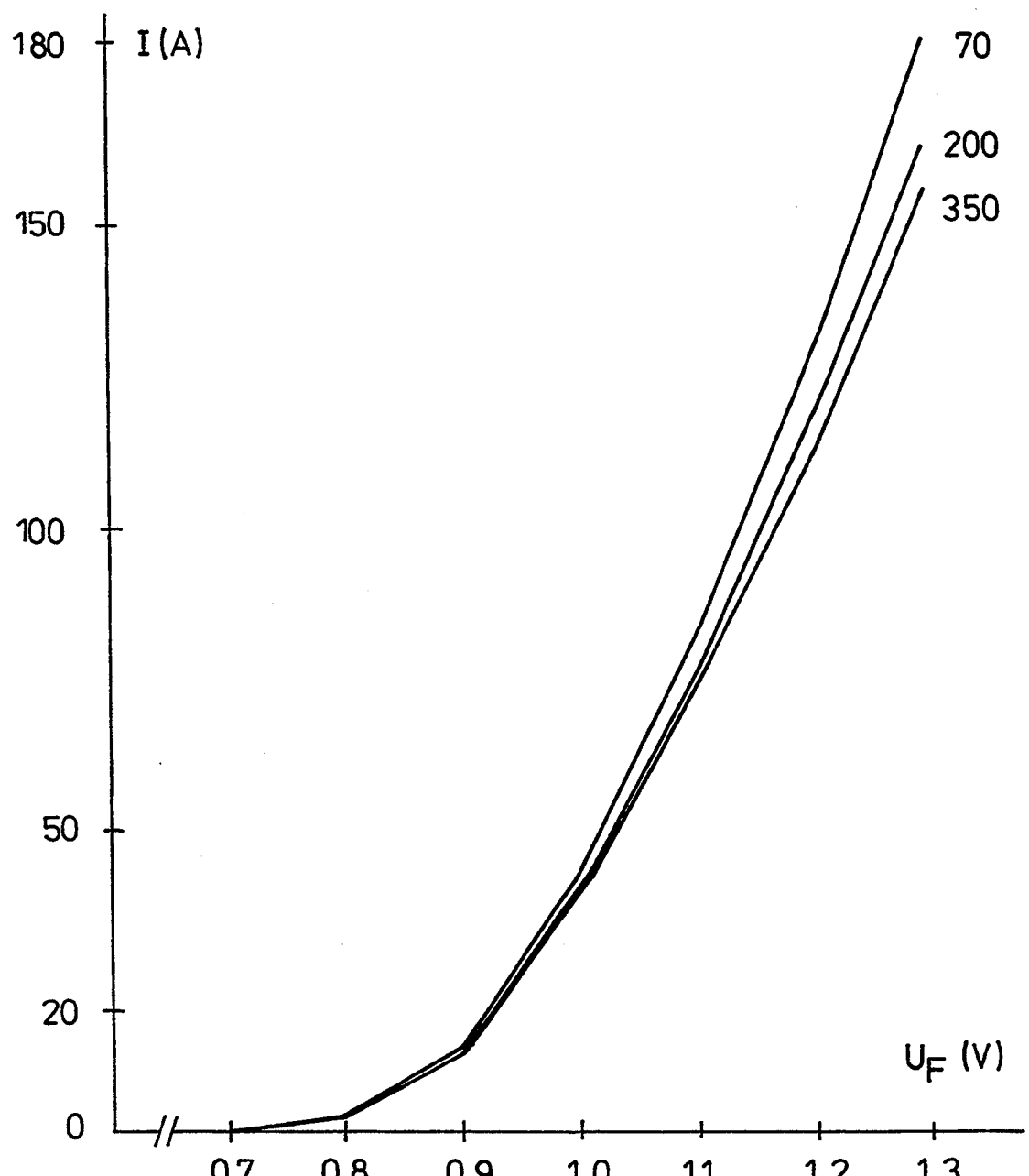
FIG. 9 is a diagram that shows the influence of the p+-thickness on the forward voltage in a diode produced in accordance with the process of the present invention.

The relatively large thickness of wafer 2 possible with the process of the present invention can be used advantageously as a heat buffer in power diodes in impulse operation. The increase in the forward voltage $U_F$ that has to be taken into account, can —according to FIG. 9—be accepted without difficulty. FIG. 9 shows the forward voltage $U_F$ as a function of the current I. This is based on a component with a chip area of 14.2 mm$^2$, an n$^-$ thickness of 75 $\mu$m, and an n$^+$ thickness of 175 $\mu$m. Three curves are given, with parameters of the p$^+$ thickness of 70 $\mu$m, 200 $\mu$m, and 350 $\mu$m. It can be seen that an increase in p$^+$ thickness from 100 $\mu$m to 350 $\mu$m causes the forward voltage $U_F$ at I=100 A to rise only by about 12 mV.

The process according to the present invention can naturally be applied similarly to other starting Si wafers, for example to larger lightly-doped zones in the n-wafer or for production of Zener power diodes, where the n/n$^+$ wafer is replaced by a suitable highly homogeneously doped n-wafer.

It can be advantageous that no separation into individual chips be done, but to keep the close arrangement on the wafer system 7 in part. This can have a special advantage when chips for Zener diodes for rectifiers of a KFZ direct-current generator are involved. In "load-dump" loading of a KFZ rectifier, at least two Zener diodes are connected together in parallel in the backward direction. In order to avoid overloading a Zener diode, the difference in the Zener voltage of the two diodes must be minimal. To minimize this difference, a sorting of the individual chips into voltage classes is usually made, and they are used in the rectifier by classes. This expense is saved when neighboring chips 8 produced in accordance with the present invention remain on the saw foil after the sawing and are installed from there—after an electrical-measurement step—directly into the rectifier. The close arrangement on the wafer system 7 is thus preserved in regard to installation in the rectifier. The SFB method according to the present invention is used, and since only a scattering in the n-middle zone remains, the Zener voltages of neighboring Zener diodes of neighboring chips 8 produced according to the present invention differ only minimally from one another.

By the SFB process, there is a very good possibility for influencing the carrying lifetime, and therefore the charge-carrying combinations, and thereby the switching time of the diodes and their pn-junctions, which are defined precisely.

What is claimed is:

1. A process for the production of semiconductor elements, comprising the steps of:
    (a) bonding together, using a silicon-fusion bonding process, an upper and a lower semiconductor body of different conducting types and suitable doping, so that a bonded semiconductor assembly is formed with a p-n junction between the bonded semiconductor bodies;

(b) forming grooves, in an upper surface of the bonded semiconductor assembly, with a depth extending at least to the p-n junction, thereby partitioning the bonded semiconductor assembly into a plurality of semiconductor elements, each with an individual p-n junction having sides exposed by the grooves;

(c) over-etching the sides of the individual p-n junctions;

(d) applying passivation to the upper surface of the bonded semiconductor assembly and to the grooves, thereby forming a passivated upper surface and passivated grooves;

(e) mechanically removing the passivated upper surface until the upper surface is again exposed;

(f) metal-coating the upper surface and a lower surface of the bonded semiconductor assembly; and (g) separating the semiconductor elements from the bonded semiconductor assembly.

2. The process according to claim 1, wherein the silicon-fusion bonding is performed at temperatures over 1000° C. for more than one hour.

3. The process according to claim 2, wherein the silicon-fusion bonding is performed at approximately 1080° C. for approximately two hours in a nitrogen atmosphere.

4. The process according to claim 1, wherein the grooves completely cut through the upper semiconductor body and partly cut into the lower semiconductor body.

5. The process according to claim 1, wherein the etching step is done with wet chemicals, particularly hot potash lye.

6. The process according to claim 1, wherein the step of applying passivation includes applying a paint having properties of a polyesterimide paint in the grooves.

7. The process according to claim 6, wherein the paint is thinned with water.

8. The process according to claim 7, wherein the bonded semiconductor bodies are brought to a temperature of approximately 70° C. before the paint is applied.

9. The process according to claim 1, wherein the step of applying passivation includes thermal oxidation and applying paint.

10. The process according to claim 9, wherein the thermal oxidation is performed at temperatures above 1000° C.

11. The process according to claim 9, wherein the paint has properties of a polyesterimide paint.

12. The process according to claim 1, wherein the step of applying passivation includes precipitation of a substance.

13. The process according to claim 12, wherein the precipitation includes a pyrolytic precipitation process.

14. The process according to claim 12, wherein the substance includes silicon nitride.

15. The process according to claim 1, wherein the step of applying passivation includes applying a polyimide paint to the grooves.

16. The process according to claim 1, wherein the step of metal-coating includes distilling and or sputtering a metal onto the surfaces.

17. The process according to claim 1, wherein the upper and lower surfaces of the bonded semiconductor assembly are metal-coated simultaneously.

18. The process according to claim 17, wherein the upper and lower surfaces are metal-coated simultaneously with adhesion layers comprising metals selected from the group consisting of chrome and titanium, solderable layers comprising metals selected from the group consisting of nickel and nickel-vanadium, and covering layers comprising metals selected from the group consisting of gold and silver.

19. The process according to claim 1, wherein the step of separating the semiconductor elements from each other includes forming separation gaps in the passivated grooves so that both semiconductor bodies are penetrated completely, and passivation material remains to cover the sides of the semiconductor elements.

20. The process according to claim 19, wherein the separation gaps are formed by sawing.

* * * * *